United States Patent
Spokoiny et al.

(10) Patent No.: US 7,814,965 B1
(45) Date of Patent: Oct. 19, 2010

(54) AIRFLOW HEAT DISSIPATION DEVICE

(75) Inventors: Michael Spokoiny, Chico, CA (US); James M. Kerner, Chico, CA (US); Xinliang Qiu, Chico, CA (US); Craig J. Lux, Chico, CA (US); James W. Maurus, Sumner, WA (US)

(73) Assignee: United States Thermoelectric Consortium, Chico, CA (US)

( * ) Notice: Subject to any disclaimer, the term of this patent is extended or adjusted under 35 U.S.C. 154(b) by 1003 days.

(21) Appl. No.: 11/602,684

(22) Filed: Nov. 20, 2006

Related U.S. Application Data

(63) Continuation-in-part of application No. 11/262,301, filed on Oct. 27, 2005, now Pat. No. 7,578,337, and a continuation-in-part of application No. 11/506,726, filed on Aug. 18, 2006.

(60) Provisional application No. 60/738,686, filed on Nov. 21, 2005.

(51) Int. Cl.
F28F 7/00 (2006.01)
H05K 7/20 (2006.01)

(52) U.S. Cl. .............. 165/80.3; 165/80.4; 165/104.33

(58) Field of Classification Search .............. 165/80.3, 165/80.4, 122, 104.33, 104.34, 185; 361/695, 361/697, 699, 702, 703, 704; 257/714; 174/16.3
See application file for complete search history.

(56) References Cited

U.S. PATENT DOCUMENTS

| | | | |
|---|---|---|---|
| 3,229,763 A | 1/1966 | Rosenblad | |
| 4,938,280 A | 7/1990 | Clark | |
| 5,021,924 A | 6/1991 | Kieda | |
| 5,063,476 A | * 11/1991 | Hamadah et al. | ............ 361/697 |
| 5,170,319 A | 12/1992 | Chu | |
| 5,183,104 A | 2/1993 | Novotny | |
| 5,220,804 A | 6/1993 | Tilton | |
| 5,224,538 A | 7/1993 | Jacoby | |
| 5,263,536 A | * 11/1993 | Hulburd et al. | ............ 165/80.4 |
| 5,269,146 A | 12/1993 | Kerner | |
| 5,365,400 A | * 11/1994 | Ashiwake et al. | ............ 361/752 |
| 5,412,536 A | 5/1995 | Anderson | |
| 5,604,665 A | * 2/1997 | Chrysler et al. | ............. 361/703 |
| 5,774,334 A | * 6/1998 | Kawamura et al. | .......... 361/699 |

(Continued)

OTHER PUBLICATIONS

Ekkad et al., Dimple Enhanced Heat Transfer in High Aspect Ratio Channels, J. Enhanced Heat Trans., 2003, pp. 395-405, vol. 10(4).

(Continued)

Primary Examiner—Tho v Duong
(74) Attorney, Agent, or Firm—The Webostad Firm

(57) ABSTRACT

Airflow-based heat dissipation is described. A heat sink includes a housing with a first chamber and a second chamber separated by an interface located below the first chamber. The first chamber has sidewalls with first side ports and an access opening. Pins extend from a top surface of the interface into the first chamber. The top surface of the interface has dimples located between the pins and first passageways which extend from the dimples of the top surface to a bottom surface of the interface. The second chamber has a network of tunnels with ends that extend to the sidewalls to provide second side ports. The first passageways extend to the network of tunnels.

14 Claims, 13 Drawing Sheets

U.S. PATENT DOCUMENTS

| | | |
|---|---|---|
| 5,781,411 A | 7/1998 | Feenstra |
| 5,831,824 A | 11/1998 | McDunn |
| 5,841,634 A * | 11/1998 | Visser ................. 361/699 |
| 5,988,266 A * | 11/1999 | Smith et al. ............. 165/78 |
| 6,141,214 A | 10/2000 | Ahn |
| 6,173,758 B1 | 1/2001 | Ward |
| 6,343,012 B1 | 1/2002 | Rife |
| 6,366,462 B1 | 4/2002 | Chu |
| 6,401,807 B1 | 6/2002 | Wyler |
| 6,469,898 B1 | 10/2002 | Rouchon |
| 6,650,538 B1 * | 11/2003 | Chu et al. ............. 361/688 |
| 6,666,260 B2 | 12/2003 | Tantoush |
| 6,671,172 B2 | 12/2003 | Carter |
| 6,729,383 B1 | 5/2004 | Cannell |
| 6,817,405 B2 | 11/2004 | Kamath |
| 6,820,684 B1 | 11/2004 | Chu |
| 6,914,782 B2 | 7/2005 | Ku |
| 6,940,718 B2 | 9/2005 | Gedamu |
| 6,973,801 B1 | 12/2005 | Campbell |
| 6,988,534 B2 | 1/2006 | Kenny |
| 7,000,684 B2 | 2/2006 | Kenny |
| 7,017,654 B2 * | 3/2006 | Kenny et al. ............ 165/80.4 |
| 7,120,019 B2 | 10/2006 | Foster |
| 2003/0011987 A1 | 1/2003 | Chu |
| 2003/0183368 A1 | 10/2003 | Paradis |
| 2003/0226371 A1 | 12/2003 | Rini |
| 2004/0108101 A1 | 6/2004 | Dugas |
| 2004/0150956 A1 | 8/2004 | Conte |
| 2005/0047105 A1 | 3/2005 | Gedamu |
| 2006/0042825 A1 | 3/2006 | Lu |
| 2006/0092235 A1 | 5/2006 | Sugahara |
| 2006/0126296 A1 | 6/2006 | Campbell |

OTHER PUBLICATIONS

Isaev et al., Numerical Analysis of the Jet-Vortex Pattern of Flow in a Rectangular Trench, J. Eng. Phys. & Thermophys., 2003, pp. 61-69, vol. 76(1).

Patrick, W.V., Computations of Flow Structures and Heat Transfer in a Dimpled Channel at Low to Moderate Reynolds Number, Apr. 25, 2005, Master's Thesis, Virginia Polytechnic Institute and State University.

Syred et al., Effect of Surface Curvature on Heat Transfer and Hydrodynamics Within a Single Hemispherical Dimple, J. Turbomachinery, Jul. 2001, pp. 609-613, vol. 123.

* cited by examiner

AIRFLOW HEAT DISSIPATION DEVICE

CROSS-REFERENCES TO RELATED APPLICATIONS

This non-provisional application claims priority under 35 U.S.C. §119(e) to U.S. provisional Patent Application Ser. No. 60/738,686, filed on Nov. 21, 2005, which is incorporated herein by reference in its entirety for all purposes. This application is a continuation-in-part of U.S. patent application Ser. Nos. 11/262,301, filed on Oct. 27, 2005, and 11/506,726, filed Aug. 18, 2006, which are incorporated herein by reference in their entirety for all purposes.

FIELD OF THE INVENTION

One or more aspects of the invention generally relate to dissipating heat and, more particularly, to an airflow-based heat dissipation device.

BACKGROUND OF THE INVENTION

A continuing trend in the electronics, automobile, avionics, and spacecraft industries, among other industries, is to create more and more compact apparatuses leading to an increase in the power density of such apparatuses. Accordingly, as the power density of such apparatuses increases, there may be a corresponding increase in thermal energy to be dissipated for operability of such apparatuses. Notably, the size of such apparatuses, as well as the systems in which they are implemented, may impose additional constraints on the size of heat dissipation devices used to transport such heat away.

Thus, the increase in power density of high-heat flux devices can make demands on heat dissipation devices more acute. This additional demand on the ability to transport heat is further exacerbated by generally smaller dimensions utilizable for such heat dissipation devices. Some examples of high-heat flux devices include microprocessors, graphics processing units, power-handling semiconductors, lasers, programmable logic devices, motherboards, and digital signal processors, among other known high-heat flux devices. Notably, as used herein throughout, the terms "include" and "including" shall mean include or including without limitation.

Conventional airflow-based heat dissipation devices include passageways through which air flows to transport heat away. Generally, a heat dissipating device includes a fan and a heat sink, where the heat sink includes a thermally conductive base plate with protruding fins. To increase the efficiency of heat removal, of air-based heat dissipation devices several factors are generally considered. These factors include: (1) surface area of the heat sink exposed to forced airflow; (2) airflow rate or velocity across the surface area of the heat sink, and (3) type of airflow, such as whether it is turbulent or laminar. Generally, turbulent airflow is known to be more effective at heat transfer than laminar airflow.

There are several known configurations of fan orientation of heat sinks, such as for example axial, radial, and cross-flow orientations. However, as heat dissipation demands of high-heat flux devices increase, and as these demands are further exacerbated by generally smaller dimensions utilizable for heat dissipation devices, these conventional types of fan-assisted heat-sink devices have diminishing usefulness for meeting current and evolving heat removal demands.

Accordingly, it would be desirable and useful to provide airflow-based heat dissipation more capable of meeting current and evolving heat removal demands.

SUMMARY OF THE INVENTION

One or more aspects of the invention generally relate to dissipating heat and, more particularly, to an airflow-based heat dissipation device.

An aspect of the invention relates to a heat sink with a housing having a first chamber and a second chamber separated from one another by an interface therebetween, where the interface is below the first chamber. The first chamber has at least one side wall that defines first side ports. The housing has an opening along a top thereof for access to the first chamber and to the interface therebelow. Pins extend from a top surface of the interface into an interior region of the first chamber and toward the opening. The top surface of the interface has dimples located between the pins. The interface has first passageways which extend from the dimples of the top surface of the interface to a bottom surface of the interface. The second chamber has a network of tunnels. Ends of tunnels of the network of tunnels extend to the at least one sidewall of the housing to provide second side ports. The first passageways of the interface extend from the top surface of the interface to the network of tunnels. The bottom surface of the interface forms a portion of the network of tunnels. The first passageways provide access between the first chamber and the second chamber.

Another aspect of the invention relates to a method for dissipating heat which has airflow into a first chamber of a heat sink. Vortices and turbulent air are generated within the first chamber. A first portion of the air exits from the first chamber via first side ports thereof. The air from the first chamber streams into a second chamber of the heat sink. The air streams from the streaming impact onto a bottom interior surface of the second chamber for dissipating heat. A second portion of the air exits from the second chamber via second side ports thereof.

Yet another aspect of the invention relates to a heat dissipation system with a fan. A heat sink is coupled to receive airflow from the fan. The heat sink has a housing which defines a first chamber and a second chamber separated from one another by an interface therebetween, where the interface is below the first chamber. The first chamber has at least one side wall which defines first side ports, the first side ports are for exiting a first portion of the airflow from the first chamber. The housing has an opening along a top thereof for access to the first chamber and to the interface therebelow. The fan is coupled to drive the airflow into the first chamber. There are pins which extend from a top surface of the interface into an interior region of the first chamber and toward the opening. The top surface of the interface has dimples located between the pins. The interface has passageways which extend from the dimples of the top surface of the interface to a bottom surface of the interface. The second chamber has a network of tunnels. Ends of tunnels of the network of tunnels extend to the at least one sidewall of the housing for providing second side ports. The passageways of the interface extend from the top surface of the interface to the network of tunnels. The bottom surface of the interface forms a portion of the network of tunnels. The passageways provide access between the first chamber and the second chamber for a second portion of the airflow to go from the first chamber to the second chamber. The passageways are for directing impact of the second portion of the airflow onto a lower interior surface of the network of tunnels. The second side ports are for exiting the second portion of the airflow from the second chamber after impact onto the lower interior surface of the network of tunnels.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Though particular numerical examples are described herein for purposes of clarity by way of example, it should be understood that the scope of the description is not limited to these particular numerical examples as other values may be used.

Various exemplary embodiments of heat dissipating devices are described below. Some of the heat dissipating devices described below represent a heat sink exposed to airflow. As shall become more apparent from the following description, airflow for the various heat dissipating devices described below is generally turbulent to enhance heat removal. Additionally, as shall become more apparent from the following description, even though surface area is in a compact structure of a heat sink, for an equivalent driving force, airflow velocity does not decrease as much as in conventional heat dissipating devices. Thus, the heat dissipating devices described below are less susceptible to a reduction in turbulence. Additionally, it should be appreciated from the following description that the fan-assisted heat dissipating devices described below remove heat more uniformly than prior fan-assisted heat dissipating devices, as the heat dissipating devices described below have fewer regions of stagnation in airflow channels.

Figure 1:
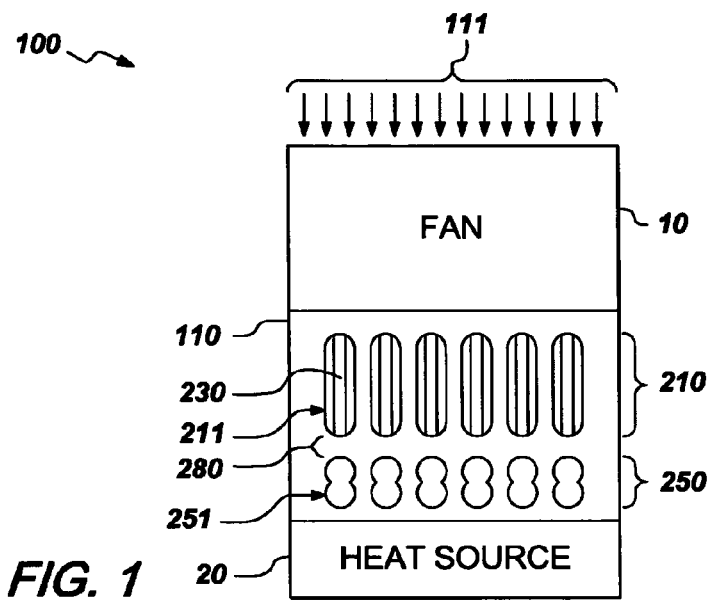
FIG. 1 is a side view depicting an exemplary embodiment of a heat dissipating system.

FIG. 1 is a side view depicting an exemplary embodiment of a heat dissipating system 100. Heat dissipating system 100 includes heat sink 110, fan 10, and a heat source 20. Although a fan 10 is illustratively shown, it should be appreciated that other types of airflow drivers may be used, such as an air compressor, a blower, and the like. Moreover, although airflow is described for air driven into heat sink 110, direction of airflow may be reversed, such as for example reversing direction of rotation of the blades (not shown) of fan 10.

Even though heat dissipating system 100 is illustratively shown in a vertical orientation, heat dissipating system 100 may have any orientation. For example, heat dissipating system 100 may be inverted from that illustratively shown in FIG. 1, or rotated for example by 90 degrees, or any other angular rotation. Notably, for purposes of clarity by way of example only and not limitation, directional terms including "up," "down," "upper," "lower," "bottom," "below," "above," and "side" shall be used herein to describe the relative location of components of various embodiments of a heat dissipating system as if such embodiments have the vertical orientation illustratively shown in FIG. 1. Also for purposes of clarity by way of example and not limitation, it shall be assumed that heat source 20 is a microchip ("chip"). However, as should be understood, heat sink 110 may be used with any of a variety of other known types of heat sources.

Chip 20 may be coupled to heat sink 110 using any of a variety of known technologies for coupling a heat sink to a microchip, including without limitation use of fusing, thermal grease, thermal paste, or a thermally conductive epoxy. Thus, an upper surface of heat source 20 may be put in contact with a bottom surface of heat sink 110 for thermal conductivity.

Airflow intake of fan 10 as generally indicated by arrows 111 is directed in a downward direction into heat sink 110. Heat sink 110 is a multi-chambered heat sink. A first chamber 210 of heat sink 110 receives the initial airflow provided from fan 10. In the interior volume of chamber 210 are pins 230, which are described below in additional detail. Between first and second chambers 210 and 250 is a perforated interface 280 allowing passage of air from first chamber 210 to second chamber 250. Notably, second chamber 250 is formed by a network of intersecting tunnels having ends associate with side ports 251. Accordingly, there may be side ports 251 on each side of heat sink 110, where tunnels associated with such side ports 251 intersect one another to form second chamber 250. Although intersecting tunnels are generally described herein as intersecting at approximately right angles to one another, such tunnels need not be orthogonal to one another. First chamber 210 and second chamber 250, or distal chamber 210 and proximal chamber 250 with reference to chip 20, have side ports 211 and 251, respectively, for purposes of airflow, which purposes are described below in additional detail.

Side ports 211 associated with first chamber 210 have an elongated opening which may generally correspond to a lengthwise orientation of pins 230. However, although pins 230 are illustratively shown with a generally vertical or perpendicular orientation with reference to a bottom of heat sink 110, it should be appreciated that any of a variety of orientations for pins 230, as well as elongated side ports 211, may be used. Side ports 251 associated with second chamber 250 may have an orientation that corresponds to or is different from the orientation of elongated side ports 211.

Airflow is driven by fan 110 into chambers 210 and 250 of heat sink 110. Such airflow driven by fan 110 first passes through a top opening and into first chamber 210 and then a portion of such airflow passes into second chamber 250. A portion of such airflow may exit via side ports 211 of first chamber 210. Airflow from first chamber 210 may be provided to second chamber 250 through holes formed in interface 280. From second chamber 250, airflow may exit via side ports 251.

Figure 2:
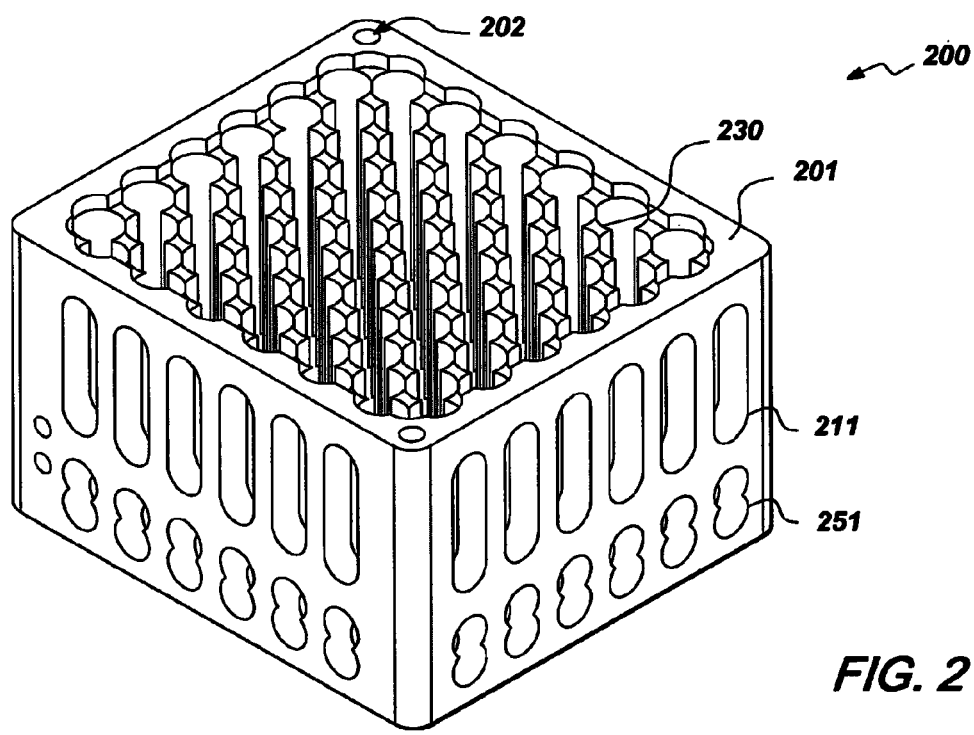
FIG. 2 is a top-down perspective view depicting an exemplary embodiment of a heat sink.

FIG. 2 is a top-down perspective view depicting an exemplary embodiment of a heat sink 200. Heat sink 200 of FIG. 2 may be heat sink 110 of FIG. 1. Heat sink 200 may have an upper rim 201. Rim 201 may provide a surface for coupling with a fan, such as fan 10 of FIG. 1. Threaded holes 202, for example, may be used for screwing down a fan to heat sink 200. Also illustratively shown in FIG. 2 are side ports 211 and 251.

Heat sink 200 includes pins 230. Pins 230 may have fins ("pin-fin structure") as described in additional detail in a co-pending patent application entitled "Fluid-Operated Heat Transfer Device," by James M. Kerner et al., application Ser. No. 11/506,726, filed Aug. 18, 2006, which is incorporated by reference herein in its entirety for all purposes. While it should be appreciated that any of a variety of cross-sectional geometries may be used for pins 230, heat conductive surface area may be enhanced by using a pin-fin structure.

Pins 230 may be positioned in an array. Though pins 230 are generally shown equally spaced apart, such equal spacing need not be used. Furthermore, pins 230 need not be positioned in an array.

Even though a generally square perimeter is shown for rim 201, it should be appreciated that any of variety of geometries may be used for heat sink 200. Such geometries may be for example curvilinear or polygonal. However, for purposes of clarity by way of example and not limitation, it shall be assumed that heat sink 200 has a generally square perimeter 201 and associated rectangular side profile, as illustratively shown in the side view of heat sink 110 of FIG. 1.

Figure 3:
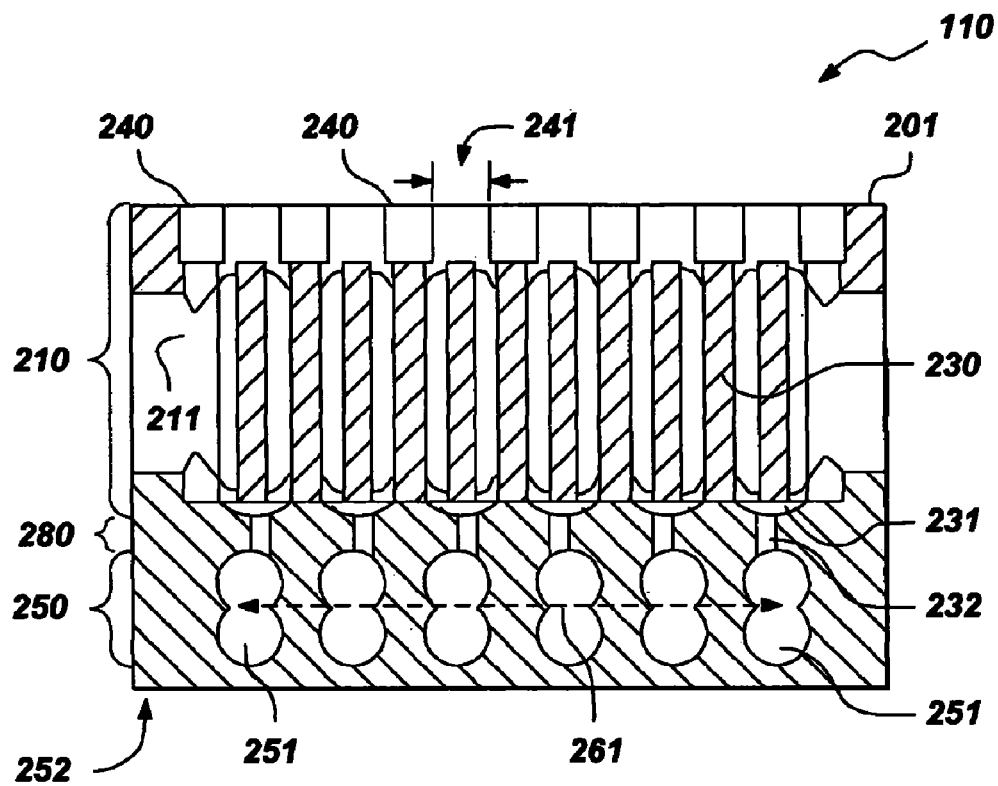
FIG. 3 is a cross-sectional side view depicting an exemplary embodiment of the heat sink of the heat dissipating system of FIG. 1.

FIG. 3 is a side cross-sectional view of heat sink 110 of FIG. 1. Optionally, heat sink 110 may include offset blocks 240. Offset blocks 240 may be attached to or form part of rim 201. Furthermore, offset blocks 240 may be located on top of or formed as part of all or some of pins 230.

A pattern of offset blocks 240 may be used defining air gaps 241. An arrangement of offset blocks 240 may provide an intake manifold for coupling airflow from a fan, such as fan 10 of FIG. 1, to first chamber 210. In addition to collimating airflow from an air driving source, offset blocks 240 may be patterned to effect more airflow in targeted locations. Air gaps 241 may be aligned to dimples 231, and such air gaps 241 and dimples 231 are spaced apart or separated from one another by pins 230. Airways 232 are defined in perforated interface 280.

Pins 230 may be positioned in an array along with an associated array of dimples 231 and an array of airways 232. More particularly, airways 232 may be formed at the bottom of dimples 231, and may be generally centered with respect to dimples 231. However, as illustratively shown in FIG. 3, airways 232 need not be centered with respect to dimples 231.

Air contacting surface of dimples 231 causes air to spin into vortices. This airflow in first chamber 210 from air gaps 241 to dimples 231 is generally turbulent. It should be appreciated that chamber 210 for an interior volume of approximately 0.2 to 1,900 cubic centimeters may have heat dissipating surface area in a range of 3.0 to 28,000 square centimeters. For such turbulent airflow, airflow velocity in first chamber 210 may be approximately 7 to 35 meters per second ("m/s") and airflow rate by volume in first chamber 210 may be approximately 4.72 to 47.19 liters/second ("l/s") or approximately 10 to 100 cubic feet/minute ("cfm").

Turbulent airflow within chamber 210 may be further facilitated by dimensioning of pins 230, dimples 231, air gaps 241, and airways 232. Example ranges of such dimensions include approximately 0.8 to 24 mm for pin height and approximately 0.3 to 5.5 mm for lateral pin length for pins 230, approximately 0.3 to 5.0 mm in diameter and approximately 0.2 to 2.5 mm in depth for dimples 231, approximately 0.2 to 10 mm width openings for air gaps 241, and approximately 0.2 to 8 mm in diameter for airways 232.

Pins 230 with fins may generally be thought of as having a star-shaped cross section with concave vertical faces tapering off into dimples 231. Concave vertical faces of pins 230 may facilitate vortex airflow. It should be further appreciated that the relatively distinct or sharp edges of pins 230 may help maintain efficient vortex airflow by reducing stagnation and reducing decrease in airflow velocity.

It should be appreciated that vortex flow both accelerates airflow and simultaneously intensifies turbulence. In addition to helping maintain vortex flow, such fins and concave surfaces of pins 230 facilitate conditions for increasing the spiraling of vortex flow above dimples 231. Turbulent flow and vortex flow facilitate heat dissipation. Furthermore, by having fins on pins 230, the effective surface area is likewise increased to enhance heat dissipation.

Airways 232 of perforated interface 280 provide air passages from first chamber 210 to second chamber 250. It should be appreciated that a multi-chambered structure may be used to effectively enlarge the surface area for heat dissipation exposed to airflow to enhance heat dissipation efficiency. Airways 232 may, though need not, be formed of a generally cylindrical configuration for forming air passageways between first chamber 210 and second chamber 250. Notably, arrangement of airways 232 may be symmetric or asymmetric, or a combination thereof, with respect to dimples 231 or side portals 251, or both. It should be appreciated that airflow in airways 232 may be generally turbulent, and airflow in second chamber 250 likewise may be generally turbulent.

Airways 232 may be used to accelerate airflow into second chamber 250 for exiting via side ports 251. Airflow through airways 232, however, may first be deflected off a bottom interior surface of chamber 250 prior to exiting via side portals 251. Accelerating airflow for impact with a bottom interior surface of chamber 250 enhances the rate of heat dissipation. More particularly, vortex airflow effectively spiraling above dimples 231 accelerates airflow into airways 232. Airways 232 may be air nozzles to cause air exiting such airways 232 to be jets. The combination of vortex air intake and jet outflow of airways 232 increases heat dissipating capability for air contacting a bottom interior surface of chamber 250 of heat sink 110.

Chamber 250 may have associated therewith a bottom plate 252 of heat sink 110. Alternatively, heat sink 110 may have a bottom rim 252, where heat sink 110, or more particularly second chamber 250 of heat sink 110, has a bottom opening. In this alternative embodiment, bottom rim 252 may be used for mounting heat sink 110 to a heat source, such as chip 20 of FIG. 1, where an upper surface of such heat source forms a bottom interior surface of second chamber 250. However, for purposes of clarity by way of example and not limitation, it shall be assumed that second chamber 250 is formed by an array of intersecting tunnels (shown in FIG. 8)

of which side ports 251 are openings. These tunnels go through a solid bottom piece of heat sink 110.

In this exemplary embodiment, side portals 251 are formed of intersecting circular tunnels, where such tunnels are formed as intersecting, vertically aligned cylinders. It should be appreciated that each side portal 251 may be generally equally spaced apart and aligned to form a substantially horizontal orientation, as generally indicated by dashed line 261.

Figure 4:
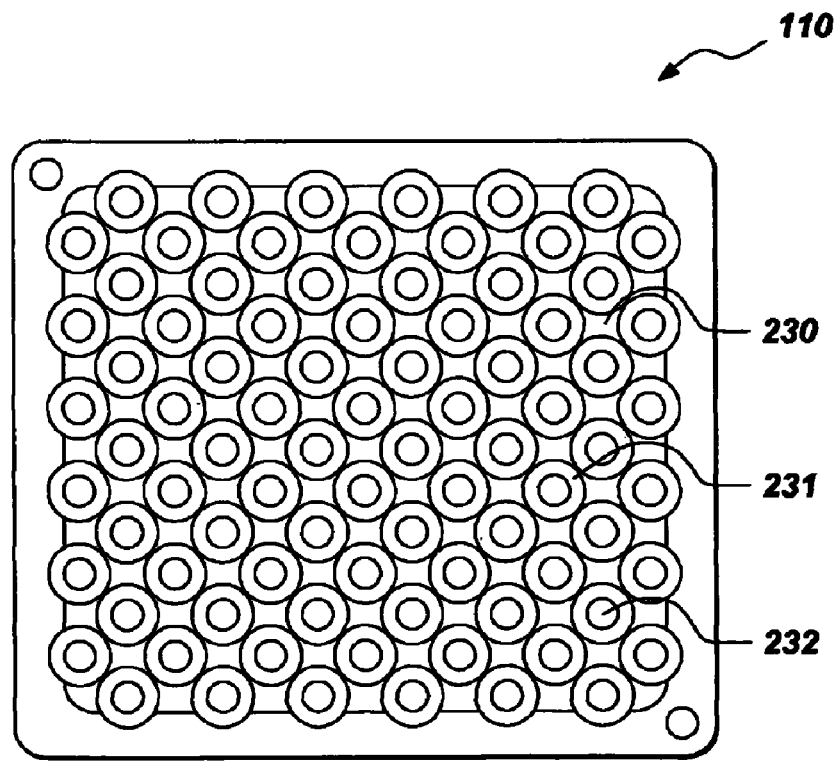
FIG. 4 is a top view depicting an exemplary embodiment of the heat sink of FIG. 3.

FIG. 4 is a top view depicting an exemplary embodiment of heat sink 110 of FIG. 3. While airways 232 are illustratively shown as being centered with respect to dimples 231, where dimples 231 and pins 230 are arrayed, it should be appreciated that other configurations may be used.

Figure 5A:
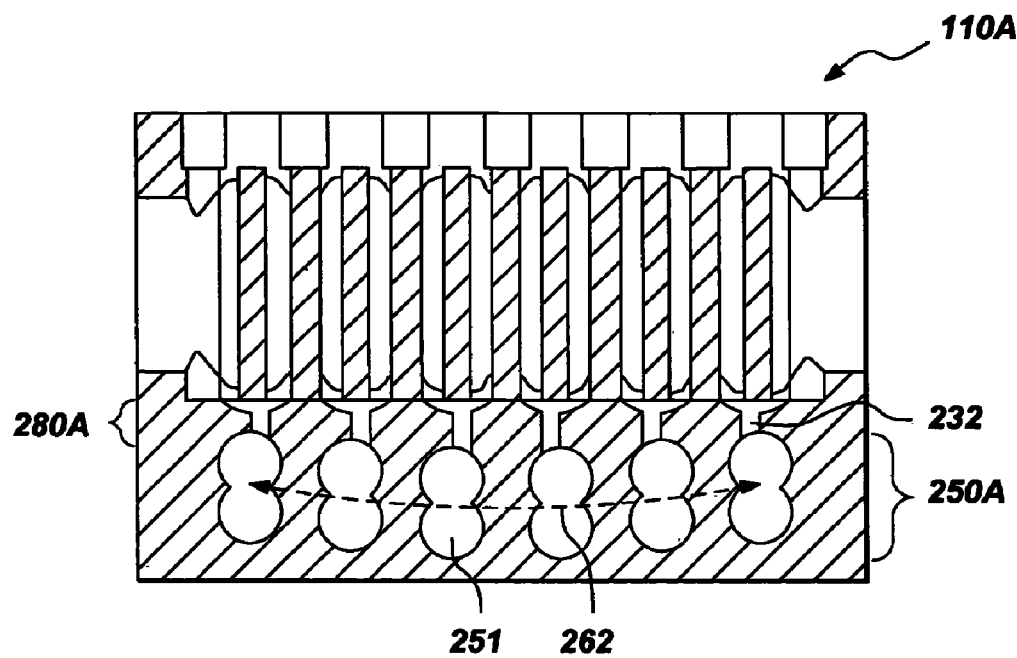
FIGS. 5A through 5N are respective cross-sectional side views depicting respective alternative exemplary embodiments of the heat sink of FIG. 3.
Figure 5B:
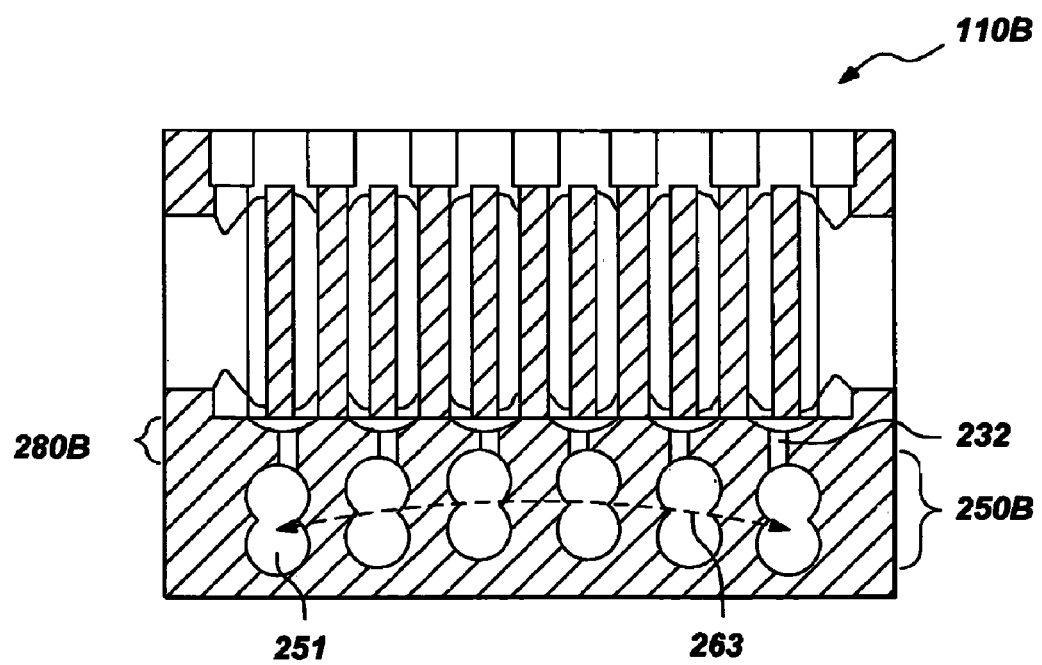
Figure 5C:
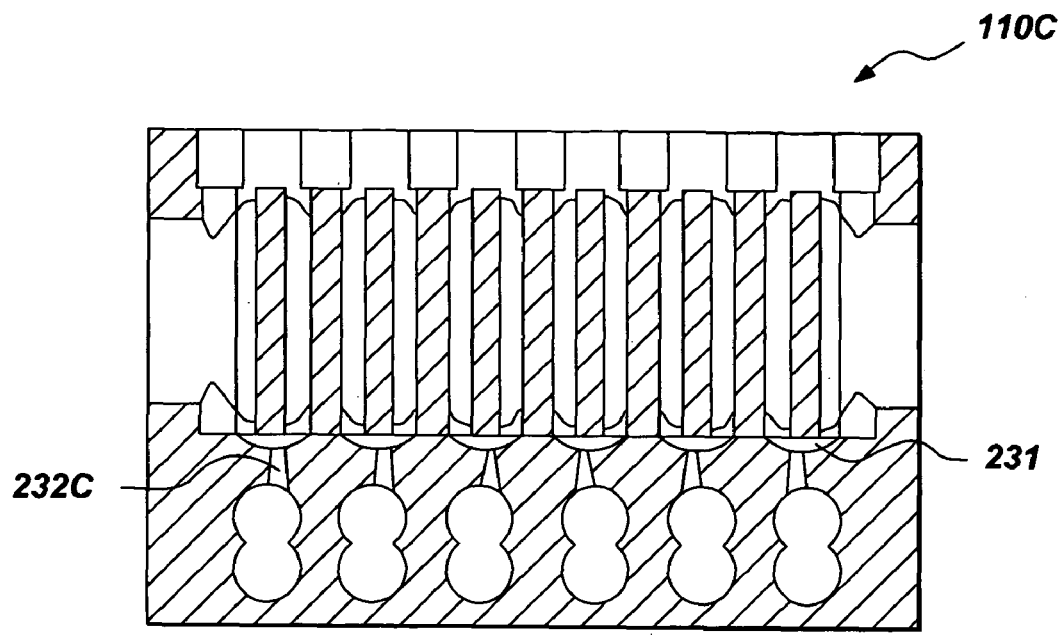
Figure 5D:
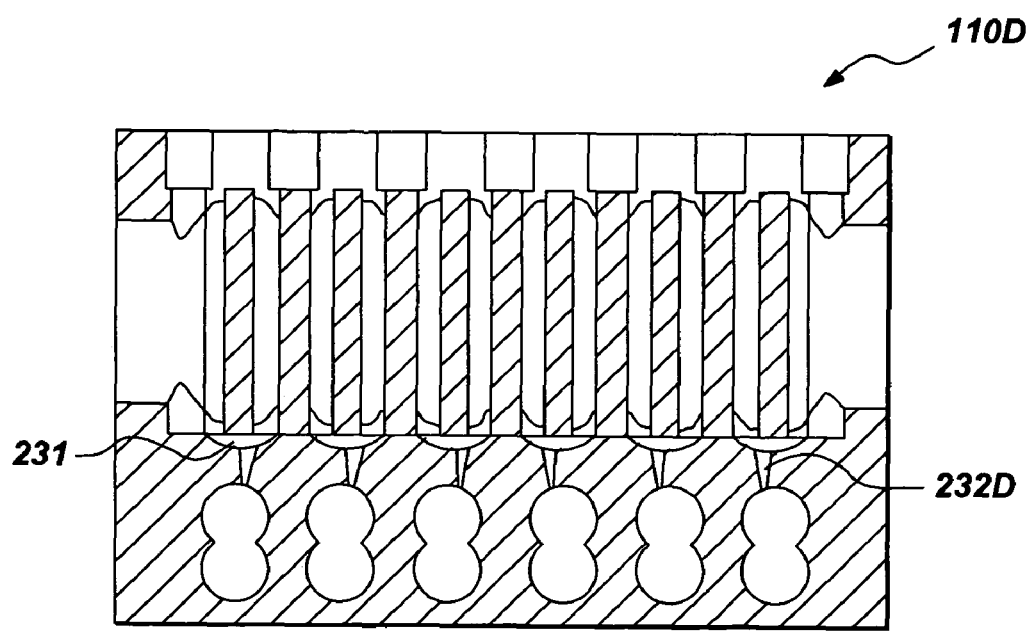
Figure 5E:
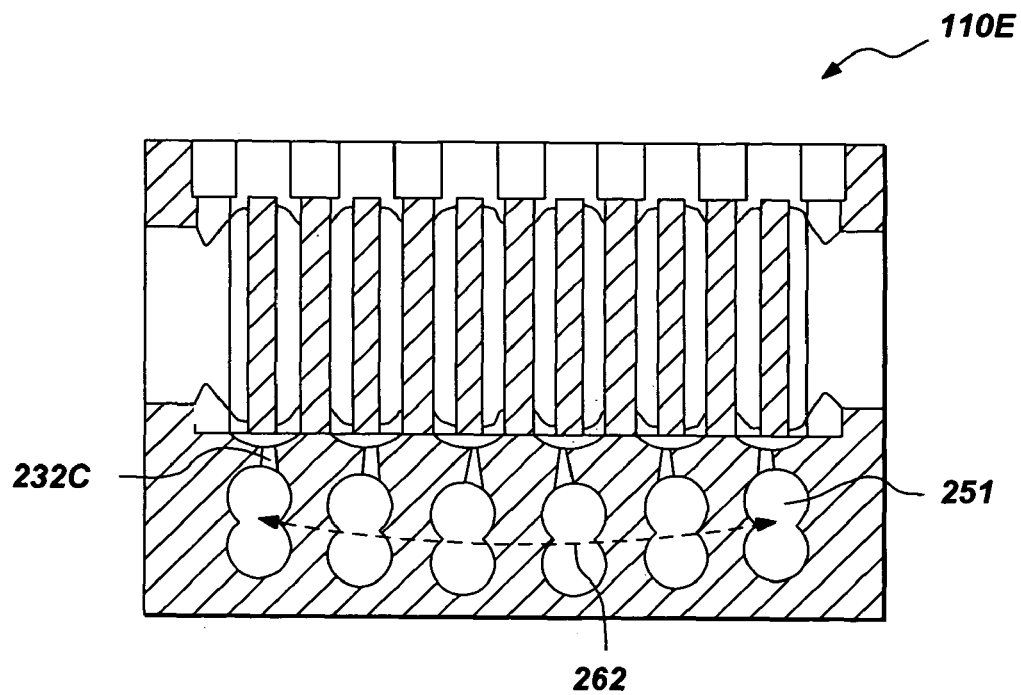
Figure 5F:
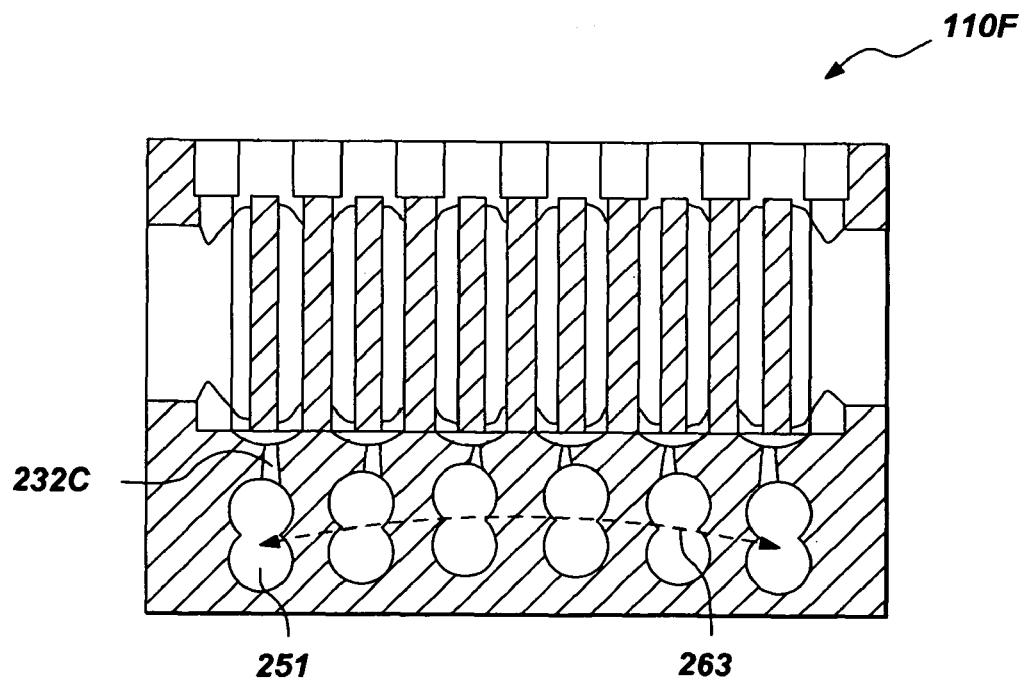
Figure 5G:
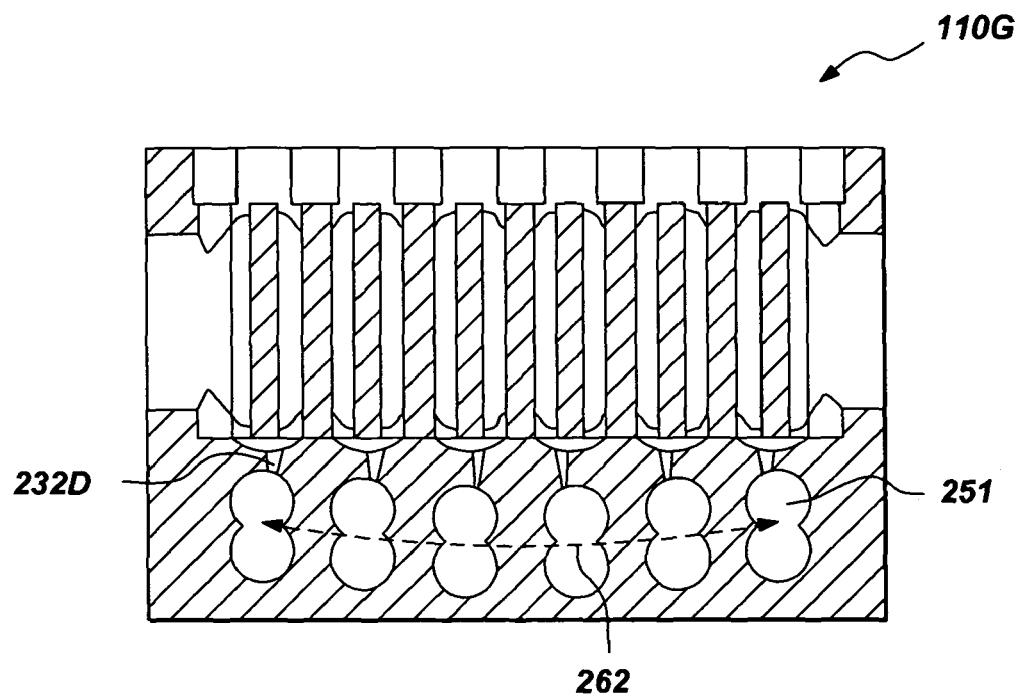
Figure 5H:
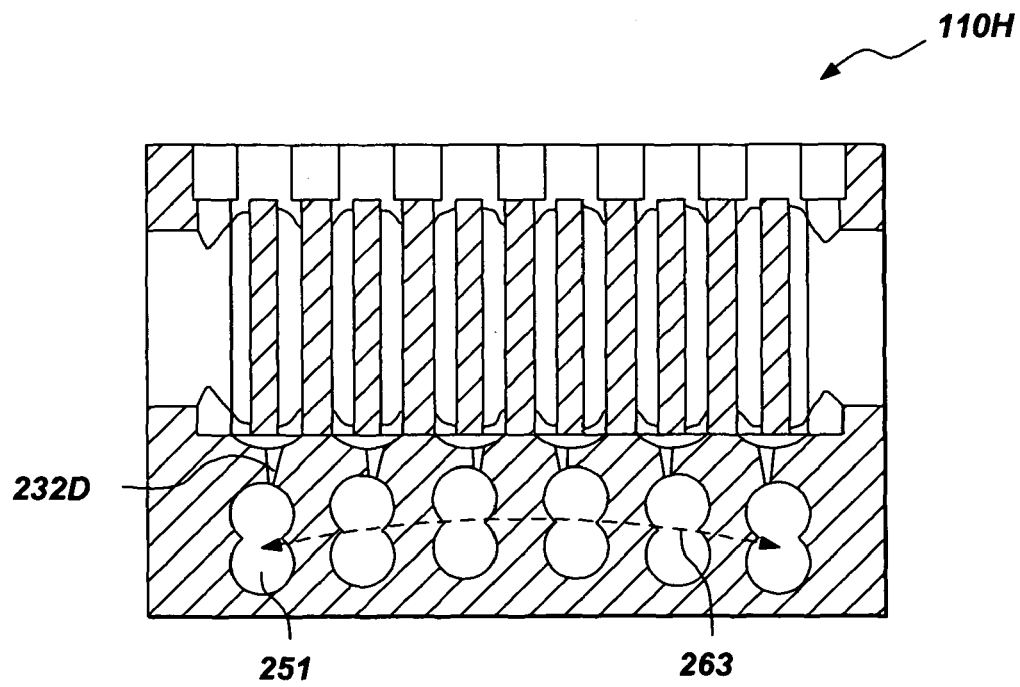
Figure 5I:
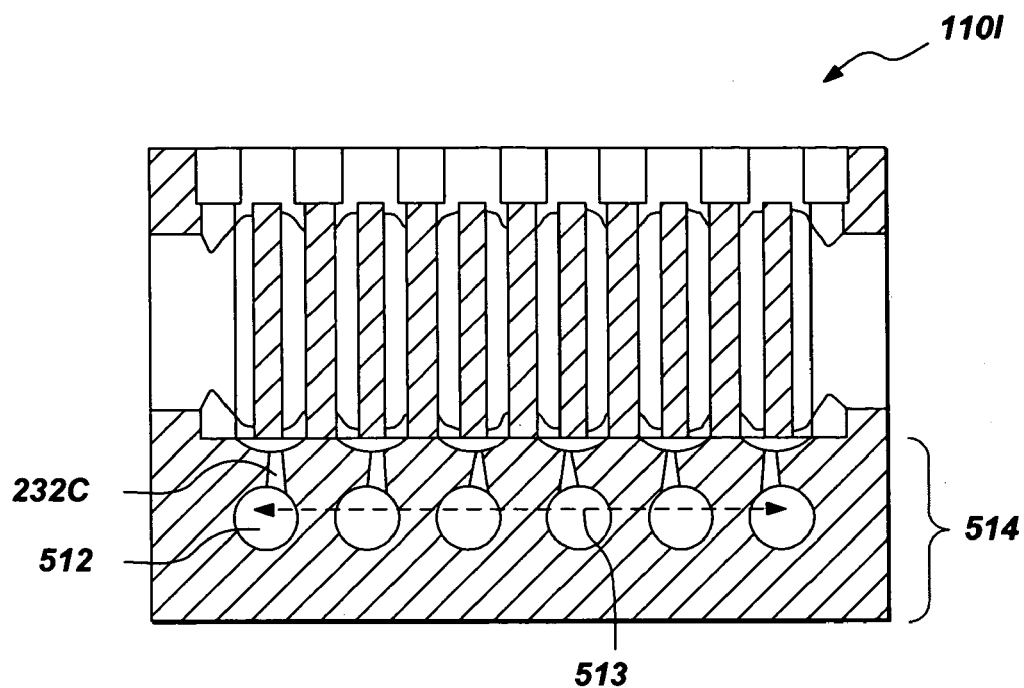
Figure 5J:
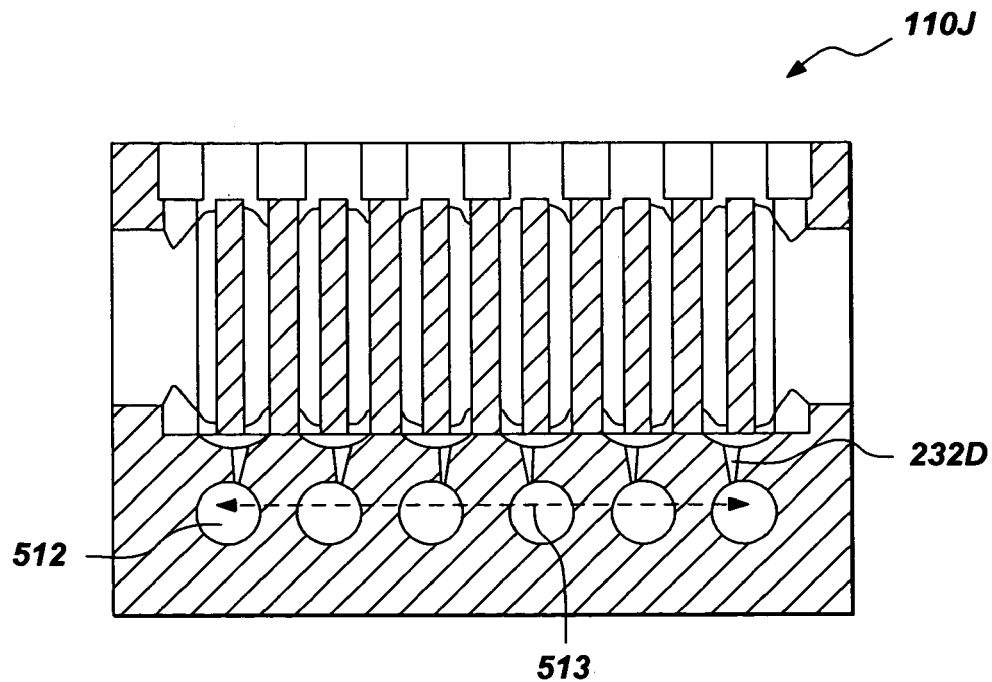
Figure 5K:
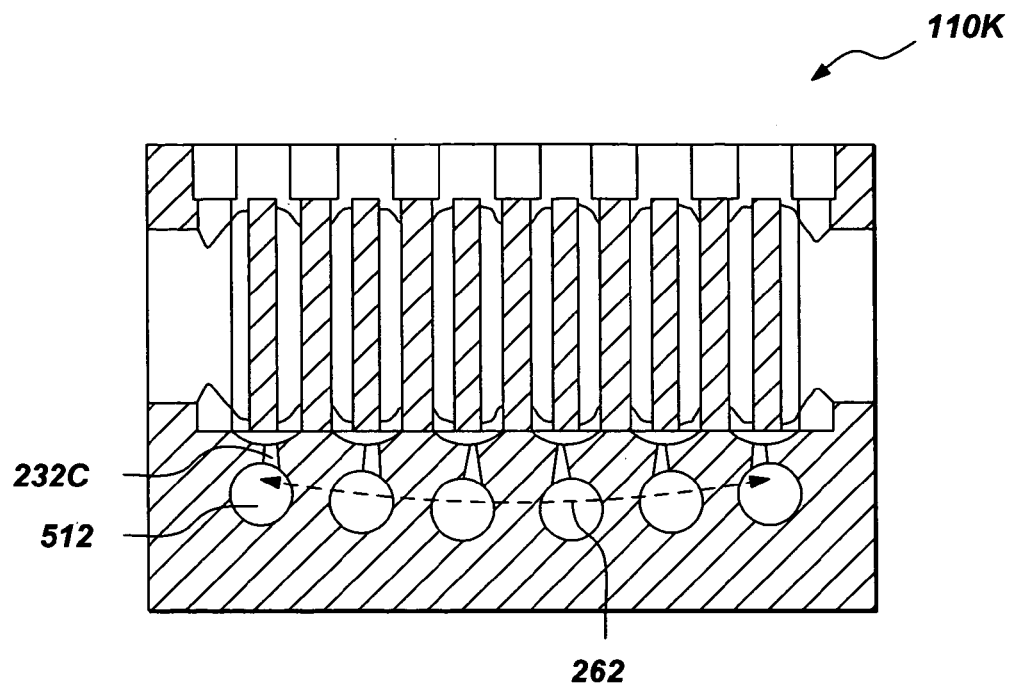
Figure 5L:
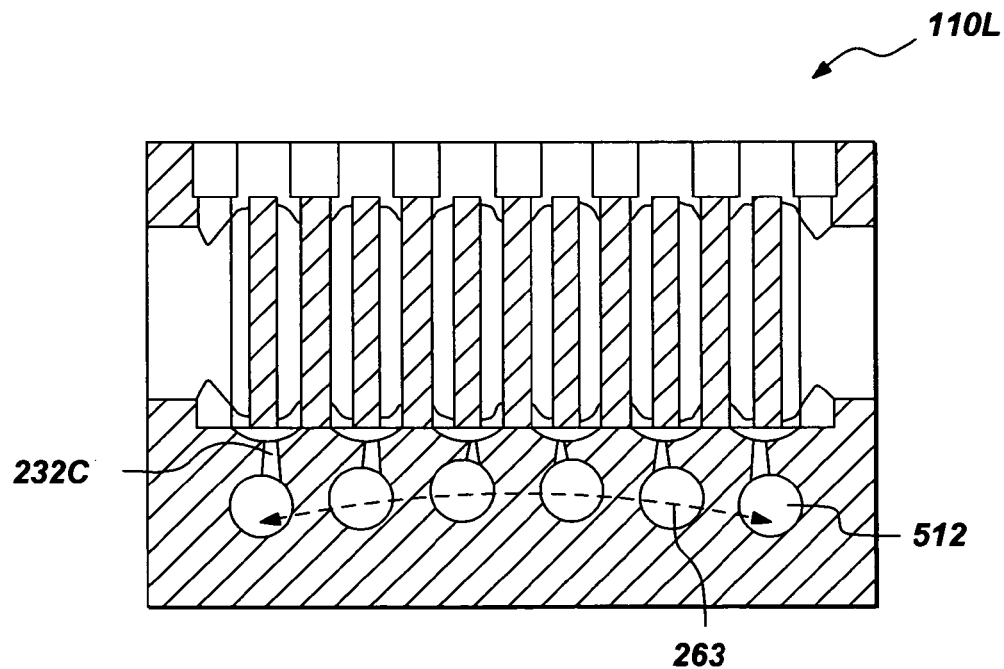
Figure 5M:
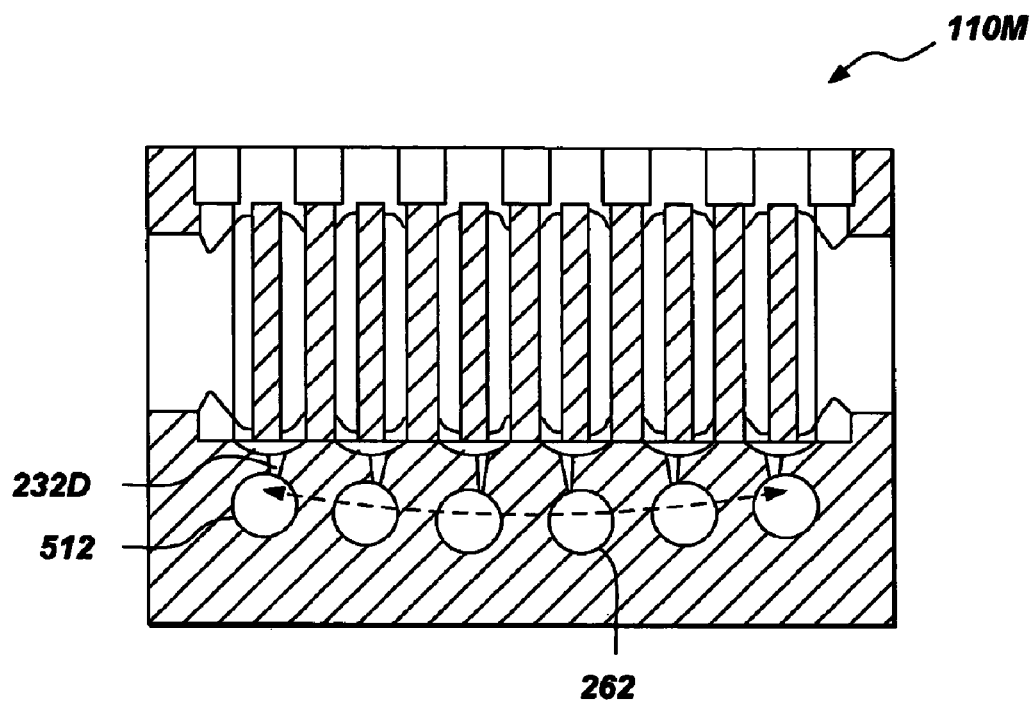
Figure 5N:
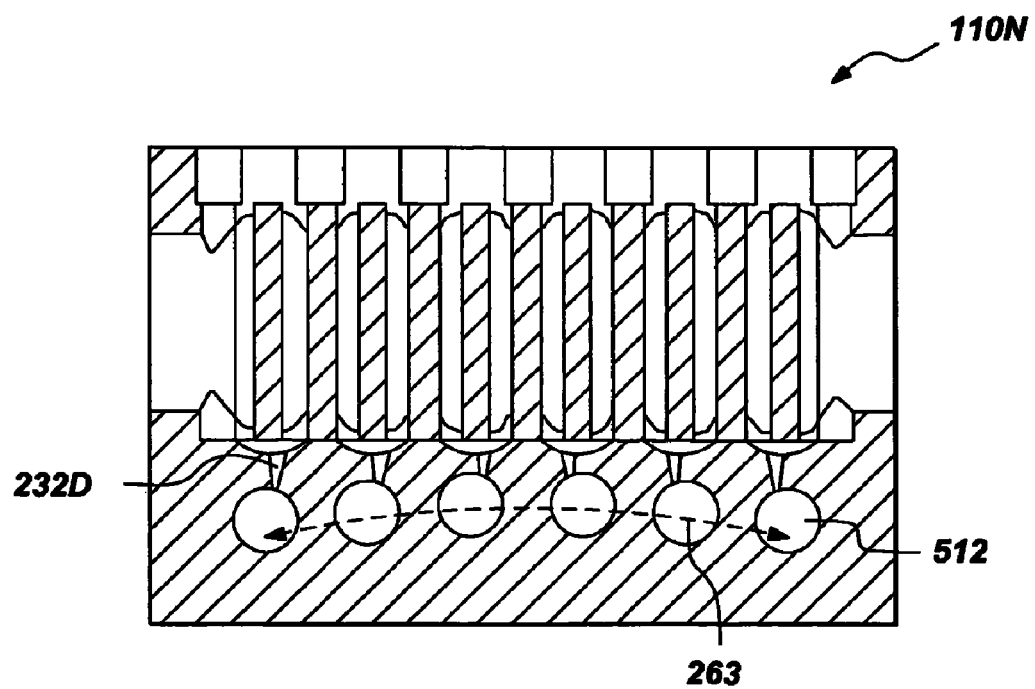

FIGS. 5A through 5N are respective cross-sectional side views depicting respective alternate exemplary embodiments of heat sink 110 of FIG. 3. In FIG. 5A, heat sink 110A includes side ports 251 arranged in a concave pattern, as generally indicated by dashed line 262, with respect to airflow direction. Notably, the concave pattern provides a second chamber 250A, which has a somewhat different configuration than second chamber 250 of FIG. 3. Second chamber 250A has tunnels intersecting at various locations in height or distance from a heat source. Moreover, second chamber 250B has some tunnels which are closer than other tunnels to a heat source.

In FIG. 5B, heat sink 110B has side ports 251 arranged in a generally convex arrangement, as generally indicated by dashed line 263, with respect to airflow direction. Notably, the convex pattern provides a second chamber 250B, which has a somewhat different configuration than second chamber 250 of FIG. 3. Second chamber 250B has tunnels intersecting at various locations in height or distance from a heat source. Moreover, second chamber 250B has some tunnels which are closer than other tunnels to a heat source. In contrast to second chambers 250A and 250B, second chamber 250 of FIG. 3 has tunnels all of which are approximately uniformly spaced from a heat source. Accordingly, it should be appreciated that distance from tunnels to a heat source may be tailored to an application for heat dissipation.

With simultaneous reference to FIGS. 5A and 5B, it should be appreciated that by arranging side ports 251 in either a convex or concave arrangement, the relative distance between air exiting airways 232 and a heat source may be varied. Airways 232 of interface 280A generally in a center region of heat sink 110A of FIG. 5A may be longer than airways 232 generally about a perimeter of heat sink 110A. In contrast, airways 232 of interface 280B of heat sink 110B of FIG. 5B may generally be longer about a perimeter region of heat sink 110B in comparison to a central region of heat sink 110B. By having airways 232 of different lengths, the airflow resulting therefrom may be more or less collimated. Longer airways 232 generally will have a more collimated exiting airflow than shorter airways 232. Airways 232 with a longer passageway may have less dispersed airflow upon contact with a bottom interior surface of second chamber 250.

With reference to FIG. 5C, heat sink 110C is heat sink 110 of FIG. 3 with airways 232C. Airways 232C are not cylindrical air passages as previously described, but are formed as horns. More particularly, the intake opening for airways 232C is smaller in diameter than the exit opening of airways 232C. Accordingly, airways 232C may have a frustoconical shape.

With reference to FIG. 5D, heat sink 110D is heat sink 110 of FIG. 3 with airways 232D. Airways 232D may be the inverse of airways 232C of FIG. 5C. More particularly, airways 232D may have an intake opening with a diameter that is larger than exit opening. Like airways 232C, airways 232D may be formed with a generally frustoconical shape, though with an opposite orientation of airways 232C. It should be appreciated that the location at which airways 232C intersect dimples 231 may be off-center from dimples 231 as illustratively shown in FIGS. 5C and 5D.

It should be appreciated that for a exit opening which is wider in diameter than an intake opening, such as illustratively shown for airways 232C of FIG. 5C, air is dispersed in a wider pattern with a reduction in velocity than air entering such airways 232C. In contrast, for a exit opening which is narrower in diameter than an intake opening, such as illustratively shown for airways 232D of FIG. 5D, exiting air has a more focused stream, such as a jet, with an increased velocity in comparison to the velocity when such air enters airways 232D.

With reference to FIG. 5E, heat sink 110E is heat sink 110A of FIG. 5A with airways 232C of FIG. 5C. Thus, exit openings of airways 232C are positioned relative to a concave curve as generally indicated by dashed line 262.

In FIG. 5F, heat sink 110F is heat sink 110B of FIG. 5B with airways 232C of FIG. 5C. Accordingly, exit openings of airways 232C are positioned along a convex curve, with respect to direction of airflow as generally indicated by dashed line 263.

In FIG. 5G, heat sink 110G is heat sink 110A of FIG. 5A with airways 232D of FIG. 5D intersecting a concave curve, as generally indicated by dashed line 262, as associated with the orientation of side ports 251. Again, the reference to concavity of the orientation of side ports 251 is with respect to the direction of airflow.

In FIG. 5H, heat sink 110H is heat sink 110B of FIG. 5B with airways 232D of FIG. 5D intersecting a convex curve arrangement of side ports 251, as generally indicated by dashed line 263.

In FIG. 5I, heat sink 110I is heat sink 110C of FIG. 5C with side ports 512. Side ports 512 are different from side ports 251 of FIG. 5C, for example, as only a single cylindrically shaped tunnel is provided for providing side ports 512. Side ports 512 have a generally horizontal arrangement, as indicated by dashed line 513. Notably, because only a single tunnel is used for providing side ports 512, the vertical dimension or overall height of heat sink 110I may be reduced in comparison with the vertical dimension of heat sink 110C. Furthermore, for heat sink 110I having a relatively shorter overall height, more heat may be dissipated in the upper chamber, namely first chamber 210.

It should be appreciated that in an embodiment, a bottom portion 514 of any of the heat sinks described herein, including heat sink 110I, may essentially be solid material in which side ports, such as side ports 512 or side ports 251, are formed with through holes or tunnels. These through holes may be spaced apart. Furthermore, these through holes may extend from front to back and from left to right, intersecting one another forming an array of tunnels.

Intersecting this array of tunnels are airways are generally frustoconical airways 232C. Notably, though not illustratively shown, airways 232 may be formed in a heat sink, such as heat sink 110I, instead of or intermixed with airways 232C or 232D. Furthermore, any of a variety of types of airways, such as airways 232, 232C, and 232D may be combined with any of a variety of side ports, such as side ports 251 and 512, in a single heat sink. This flexibility allows a heat sink to be tailored to an application or, more particularly, to the heat source with which such heat sink is to be used.

In FIG. 5J, a heat sink 110J is heat sink 110D of FIG. 5D with side ports 512 with a horizontal arrangement as generally indicated by dashed line 513. Heat sink 110J includes airways 232D for intersecting tunnels associated with side ports 512.

With reference to FIG. 5K, a heat sink 110K is heat sink 110I of FIG. 5I with side ports 512 in a concave arrangement, as generally indicated by dashed line 262. Furthermore, heat sink 110K has airways 232C intersecting tunnels associated with side ports 512.

In FIG. 5L, heat sink 110L is heat sink 110I of FIG. 5I with side ports 512 in a generally convex arrangement, as indicated by dashed line 263. Heat sink 110L has airways 232C intersecting tunnels associated with side ports 512.

In FIG. 5M, heat sink 110M is heat sink 110J of FIG. 5J with side ports 512 in a generally concave arrangement, as indicated by dashed line 262. In heat sink 110M, airways 232D intersect tunnels associated with side ports 512.

In FIG. 5N, heat sink 110N has side ports 512 in a generally convex arrangement as indicated by dashed line 263. Heat sink 110N has airways 232D intersecting side ports 512.

Figure 6:
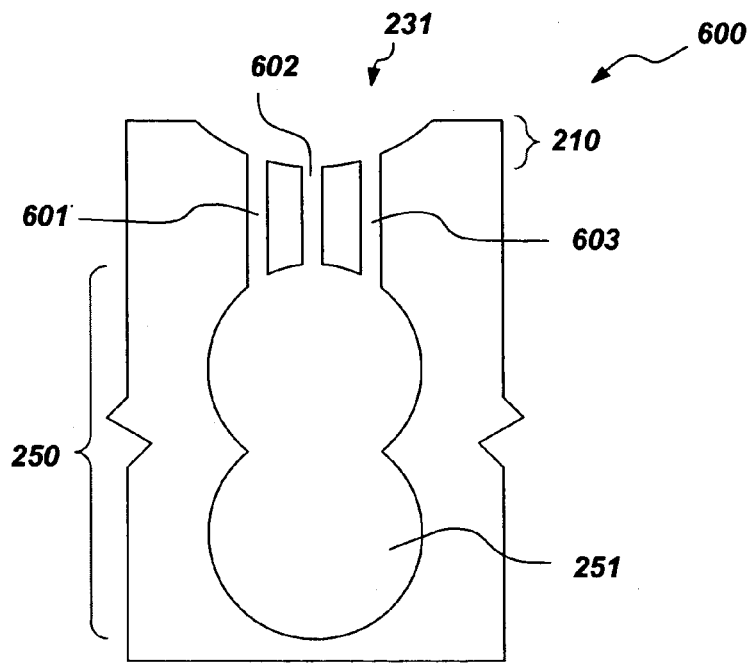
FIG. 6 is a cross-sectional view depicting an exemplary embodiment of a multi-airway arrangement.

It has been assumed that there is only one airway for each dimple. However, not all dimples need to have airways. Furthermore, there need not be only one airway for each dimple. In FIG. 6, there is shown a cross-sectional view depicting an exemplary embodiment of a multi-airway arrangement 600.

In multi-airway arrangement 600, airways 601, 602, and 603 associated with a single dimple 231 provide respective air passages from first chamber 210 to second chamber 250, which in this exemplary embodiment is formed using side ports 251.

It should be appreciated that in this particular example each airway 601 through 603 is generally a cylinder which intersects respective concave surfaces associated with a dimple 231 and an upper portion of a side port 251. It should further be appreciated that even though each of airways 601 through 603 is illustratively shown generally as a cylinder, any combination of shapes for airways 601 through 603 may be used, including a generally frustoconical or inverted frustoconical shapes. Furthermore, although for example airway 602 is illustratively shown as being centered with respect to dimple 231, airway 602 need not be centered with respect to such dimple 231.

Figure 7:
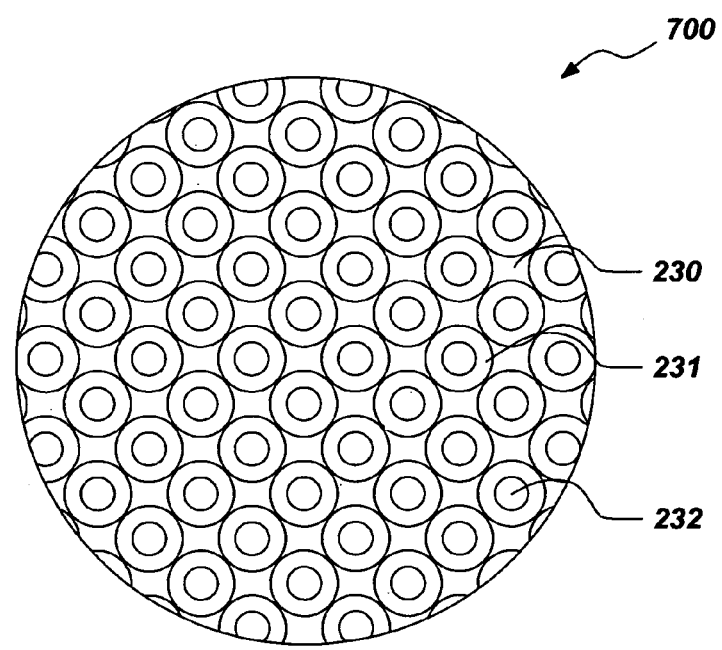
FIG. 7 is a top view depicting a portion of an alternative exemplary embodiment of a heat sink.

FIG. 7 is a top view depicting a portion of an alternative embodiment of a heat sink 700 with pins 230, dimples 231, and airways 232. It should be appreciated heat sinks as described herein may have any of a variety of shapes, and thus for example may have a generally cylindrical shape as does heat sink 700 of FIG. 7.

Figure 8:
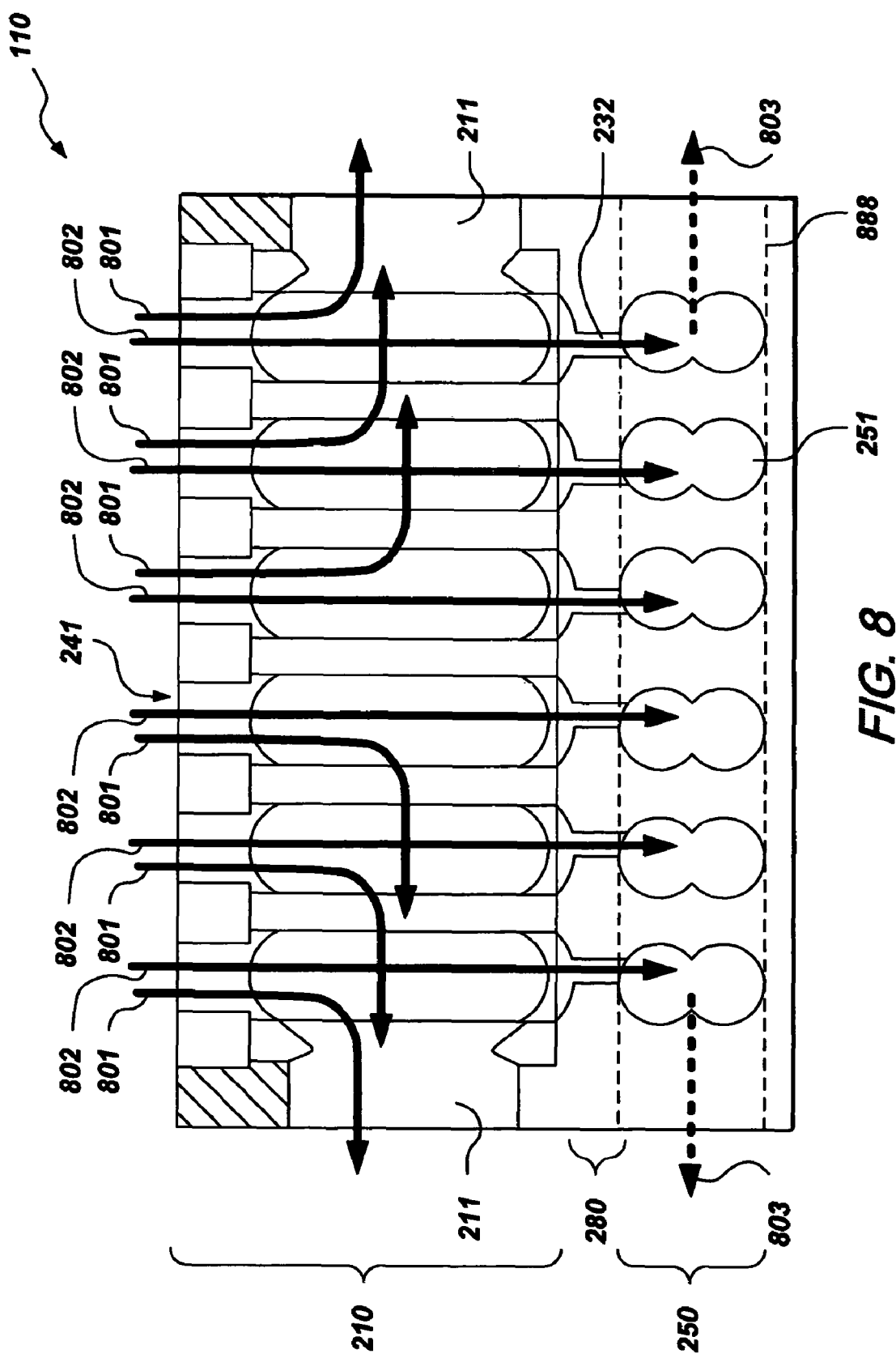
FIG. 8 is a cross-sectional side view depicting an exemplary embodiment of airflow in a heat sink.

FIG. 8 is a cross-sectional side view depicting an exemplary embodiment of airflow in heat sink 110 of FIG. 3. Notably, a portion of air input to heat sink 110 as generally indicated by arrows 801 may pass through airgaps 241 and enter first chamber 210. Such airflow as generally indicated by arrows 801 may exit first chamber 210 via elongated side ports 211.

Another portion of air input to heat sink 110, as generally indicated by arrows 802, may enter first chamber 210 via airgaps 241 and pass through first chamber 210 to second chamber 250. Airflow as generally indicated by arrows 802 may pass through airways 232 of interface 280 and into the tunnels, such as tunnel 888, of second chamber 250, from which such air may exit via side ports 251. Arrows 803 indicate the direction of airflow exiting from side ports 251 of the tunnels, such as tunnel 888, of second chamber 250.

Notably, it has been assumed that heat sink 110 is used in an open air system. However, a closed gas system may employ heat sink 110, in which case a gas other than air may be used for cooling. Furthermore, it has been assumed that an air driving force drives air into heat sink 110. However, an air driving force may be reversed to remove heat from heat sink 110, in which the airflow directions in the embodiment of FIG. 8 are reversed. More particularly, the direction of airflow as indicated by arrows 801, 802, and 803 may be reversed by reversing the direction of a fan or the rotation of fan blades of a fan for example.

Alternatively, it is not necessary that a fan be used to pull air in a reverse direction using heat sink 110, as other forms of air or gas suction may be used.

Figure 9:
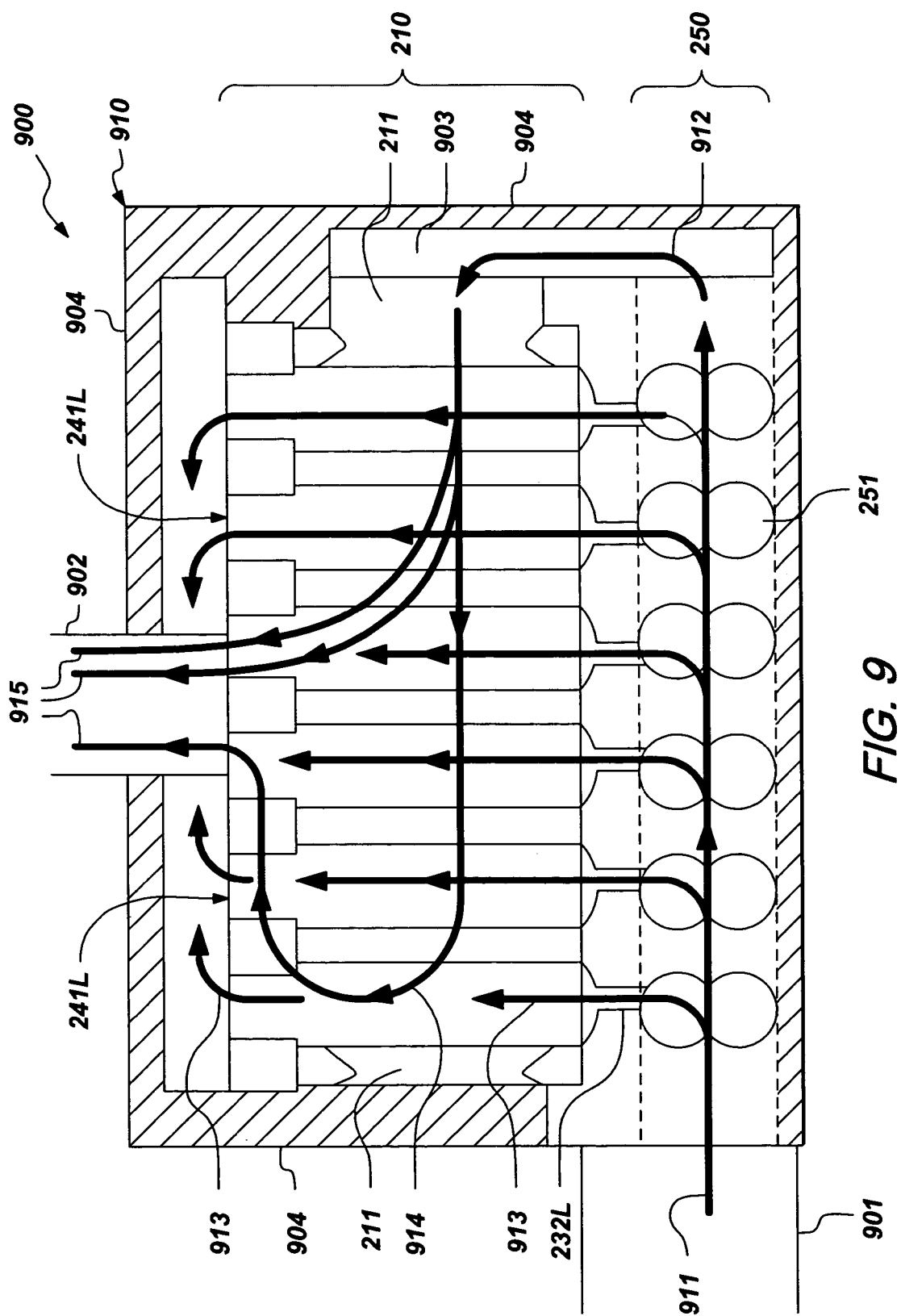
FIG. 9 is a cross-sectional side view depicting an exemplary embodiment of use of a heat sink in a liquid cooling system.

It has been assumed that a heat sink 110, and various embodiments thereof, are used in an air, or more generally a gas, cooling system. However, heat sink 110 may be modified for use in a liquid cooling system. FIG. 9 is a side cross-sectional view depicting an exemplary embodiment of use of a heat sink 910 in a liquid cooling system 900. Heat sink 910 is similar to heat sink 110 of FIG. 3, except heat sink 910 is basically a modified version of heat sink 110 for purposes of liquid cooling. Manifolds, pipes, or other liquid conduits, such as liquid conduits 901 and 902, may be coupled to heat sink 910. More particularly, inlet conduit 901 may be used to provide liquid to heat sink 910, and outlet conduit 902 may be used to remove liquid from heat sink 910. Thus, liquid flow, as generally indicated by arrow 911, flows into inlet conduit 901 and then into chamber 250 of heat sink 910 via left side ports 251. However, in this embodiment, side ports 251 do not have access to outside air, but are sealed by sidewalls 904. Sidewalls 904 may include passageways or channels 903 for allowing liquid exiting right side ports 251 to go through elongated side ports 211 to first chamber 210. However, a left sidewall 904 need not include a channel 903, where it is associated with an inlet side of heat sink 910. In this embodiment, elongated side ports 211 do not have access to open air, as they are sealed from such access by sidewalls 904. Notably, front and back sides of heat sink 910 may both be like the right side of heat sink 910 illustratively shown, or one may be like the right side of heat sink 910 and the other may be like the left side of heat sink 910.

Liquid input to heat sink 910, in addition to passing from second chamber 250 to first chamber 210 via channels 903, as generally indicated by arrow 912, enters first chamber 210 from second chamber 250 via liquid passageways 232L, as generally indicated by arrows 913. Notably, liquid passageways 232L are similar to airways 232 of heat sink 110 of FIG. 3, but are for conduit of liquid.

Liquid flow via channels 903 may provide cross-flow in first chamber 210 as generally indicated by arrows 914. Furthermore, such cross-flow may be diverted, for example when contacting a sidewall 904 or passing through liquid passageways 241L to outlet 902, as generally indicated by arrows 915. Notably, liquid passageways 241L are similar to airgaps 241 of heat sink 110 of FIG. 3, but are for conduit of liquid.

It should also be appreciated that liquid flowing through liquid passageways 232 may flow into first chamber 210 and out of first chamber 210 via respective liquid passageways 241L as generally indicated by arrows 913.

In the example of system 900, liquid enters into second chamber 250 first, before entering first chamber 210. However, it should be appreciated that the direction of liquid flow may be reversed from that illustratively shown in FIG. 9. More particularly, liquid may flow first into first chamber 210 and then exit via second' chamber 250. In this alternative embodiment, outlet conduit 902 would be an inlet conduit, and inlet conduit 901 would be an outlet conduit.

Figure 10:
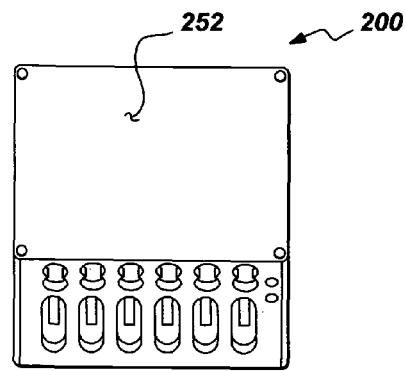
FIG. 10 is a bottom-up, perspective view depicting an exemplary embodiment of the underside of the heat sink of FIG. 2.

FIG. 10 is a bottom-up, perspective view depicting an exemplary embodiment of underside 252 of heat sink 200 of FIG. 2. Underside 252, which is illustratively shown as a solid black surface, may be placed in direct contact with a top surface of a heat generating device, such as a top surface of chip 20 of FIG. 1. Optionally, rather than placing underside 252 in direct contact with a heat source, a conventional thermoelectric device may be located between a heat source, such as chip 20 of FIG. 1, and heat sink 200.

Figure 11:
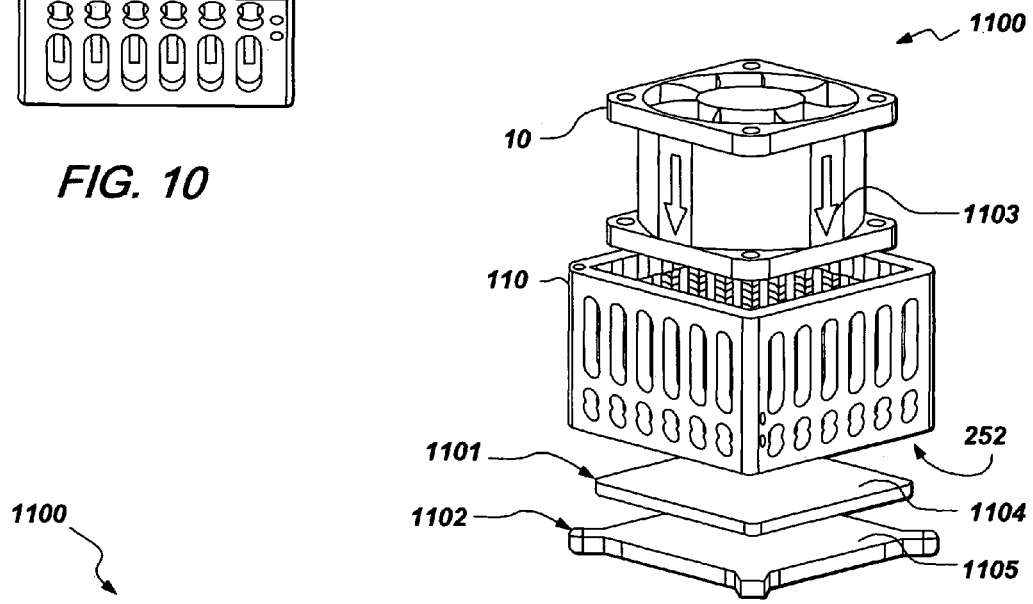
FIG. 11 is an exploded perspective view depicting an exemplary embodiment of an air cooling assembly.

FIG. 11 is an exploded perspective view depicting an exemplary embodiment of an air cooling assembly 1100. Air cooling assembly 1100 includes fan 10, heat sink 110, thermoelectric device 1101, and heat transfer plate 1102. Fan 10 may be a brushless fan, which is mounted on top of heat sink 110 for forcing air into heat sink 110 as indicated by arrows 1103 of fan 10. Accordingly, fan 10 forces air, or some other gas, into heat sink 110 for providing turbulent airflow in heat sink 110. Heat transfer plate 1102 may be used to securely mount assembly 1100 to a heat source such as chip 20 for substantially uniform contact with such heat source for thermal conduction. Thermoelectric device 1101 may be mounted between bottom surface 252 of heat sink 110 and an upper surface 1105 of thermoelectric heat transfer plate 1102.

Figure 12:
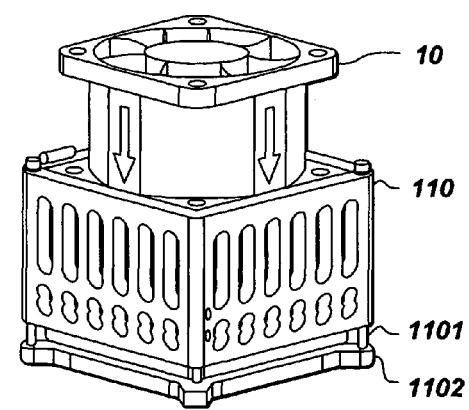
FIG. 12 is a perspective view of the assembly of FIG. 11 as it may be assembled.

Accordingly, as a heat source, such as chip 20 of FIG. 1, generates heat, such heat may be removed via a top surface of such chip 20 through thermal conduction with heat transfer plate 1102. Notably, thermal grease may be used for coupling between bottom surface 252 and an upper surface 1104 of thermoelectric device 1101. A bottom surface of thermoelectric device 1101 by application of electricity thereto (not shown) becomes cool or is cooled. Thermoelectric device 1101, conducts heat from a bottom surface thereof in contact with heat transfer plate 1102 to a top surface of thermoelectric device 1101. Such heat is thereafter dissipated by flowing air through heat sink 110. The bottom surface or cool surface of thermoelectric device 1101 may be clamped or screwed to heat transfer plate 1102. In an alternate embodiment of assembly 1100, thermoelectric device 1101 is not used, and the bottom surface 252 of heat sink 110 is directly mounted to a relatively flat top surface 1105 of heat transfer plate 1102. FIG. 12 is a perspective view of assembly 1100 of FIG. 11 as it may be assembled.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A heat sink, comprising:
   a housing defining a first chamber and a second chamber separated from one another by an interface therebetween, the interface being below the first chamber;
   the first chamber having at least one side wall defining first side ports;
   the housing having an opening along a top thereof for access to the first chamber and to the interface therebelow;
   pins extending from a top surface of the interface into an interior region of the first chamber and toward the opening;
   the top surface of the interface having dimples located between the pins;
   the interface having first passageways extending from the dimples of the top surface of the interface to a bottom surface of the interface;
   the second chamber having a network of tunnels, ends of tunnels of the network of tunnels extending to the at least one sidewall of the housing for providing second side ports;
   the first passageways of the interface extending from the top surface of the interface to the network of tunnels;
   the bottom surface of the interface forming a portion of the network of tunnels; and
   the first passageways providing access between the first chamber and the second chamber.

2. The heat sink according to claim 1, further comprising: offset blocks coupled to ends of the pins defining second passageways providing access to the first chamber.

3. The heat sink according to claim 1, wherein the pins have fins.

4. The heat sink according to claim 1, wherein the first passageways are nozzles.

5. The heat sink according to claim 4, wherein the nozzles are for airflow from the first chamber to the second chamber.

6. The heat sink according to claim 5, wherein the nozzles are for dispersing the airflow in the second chamber for contact with a lower interior surface of the network of tunnels prior to exiting via the second side ports.

7. The heat sink according to claim 5, wherein the nozzles are for focusing the airflow in the second chamber for contact with a lower interior surface of the network of tunnels prior to exiting via the second side ports.

8. The heat sink according to claim 1, wherein the dimples are for promoting vortices of air within the first chamber.

9. A heat dissipation system, comprising:
   a fan; and
   a heat sink coupled to receive airflow from the fan, the heat sink including:
     a housing defining a first chamber and a second chamber separated from one another by an interface therebetween, the interface being below the first chamber;
     the first chamber having at least one side wall defining first side ports, the first side ports for exiting a first portion of the airflow from the first chamber;
     the housing having an opening along a top thereof for access to the first chamber and to the interface therebelow;
     the fan coupled to drive the airflow into the first chamber;
     pins extending from a top surface of the interface into an interior region of the first chamber and toward the opening;
     the top surface of the interface having dimples located between the pins;
     the interface having passageways extending from the dimples of the top surface of the interface to a bottom surface of the interface;
     the second chamber having a network of tunnels, ends of tunnels of the network of tunnels extending to the at least one sidewall of the housing for providing second side ports;
     the passageways of the interface extending from the top surface of the interface to the network of tunnels;
     the bottom surface of the interface forming a portion of the network of tunnels;
     the passageways providing access between the first chamber and the second chamber for a second portion of the airflow to go from the first chamber to the second chamber;
     the passageways for directing impact of the second portion of the airflow onto a lower interior surface of the network of tunnels; and the second side ports for exiting the second portion of the airflow from the second chamber after impact onto the lower interior surface of the network of tunnels.

10. The heat dissipation system according to claim 9, further comprising a thermoelectric device coupled to a lower exterior surface of the heat sink for thermal conduction from the thermoelectric device to the heat sink for heat dissipation in part via the second portion of the airflow exited from the second chamber.

11. The heat dissipation system according to claim 10, wherein the thermal conduction includes thermal conductivity to the pins for heat dissipation in part via the first portion of the airflow exited from the first chamber.

12. The heat dissipation system according to claim 11, wherein the first portion of the airflow includes vortices and turbulent air within the first chamber; and wherein the second portion of the airflow includes streams and turbulent air within the second chamber.

13. The heat dissipation system according to claim 12, wherein the streams of air in the second chamber are from the passages, the passages being formed with air inlet openings narrower than air outlet openings.

14. The heat dissipation system according to claim 12, wherein the streams of air in the second chamber are from the passages, the passages being formed with air inlet openings wider than air outlet openings.

* * * * *